(12) United States Patent
Bauer et al.

(10) Patent No.: US 9,130,538 B2
(45) Date of Patent: Sep. 8, 2015

(54) SAW FILTER OPERATING IN A BALANCED/UNBALANCED MANNER

(75) Inventors: Thomas Bauer, Munich (DE); Andreas Detlefsen, Eichenau (DE); Stephan Bolze, Munich (DE); Ralph Durner, San Diego, CA (US)

(73) Assignee: EPCOS AG, Munich (DE)

( * ) Notice: Subject to any disclaimer, the term of this patent is extended or adjusted under 35 U.S.C. 154(b) by 387 days.

(21) Appl. No.: 13/697,328

(22) PCT Filed: May 18, 2011

(86) PCT No.: PCT/EP2011/058059
§ 371 (c)(1),
(2), (4) Date: Jan. 23, 2013

(87) PCT Pub. No.: WO2011/144664
PCT Pub. Date: Nov. 24, 2011

(65) Prior Publication Data
US 2013/0120084 A1    May 16, 2013

(30) Foreign Application Priority Data

May 21, 2010 (DE) .......................... 10 2010 021 164

(51) Int. Cl.
*H03H 9/54*   (2006.01)
*H03H 9/64*   (2006.01)
*H03H 9/00*   (2006.01)

(52) U.S. Cl.
CPC .............. *H03H 9/54* (2013.01); *H03H 9/0057* (2013.01); *H03H 9/0085* (2013.01)

(58) Field of Classification Search
CPC ... H03H 9/0057; H03H 9/0047; H03H 9/008; H03H 9/009; H03H 9/54

USPC .................................................. 333/193, 195
See application file for complete search history.

(56) References Cited

U.S. PATENT DOCUMENTS 6,972,643 B2    12/2005 Tsunekawa et al.
7,283,016 B2 *  10/2007 Haruta et al. ................. 333/133
(Continued)

FOREIGN PATENT DOCUMENTS

DE         103 04 470 A1    8/2004
DE    11 2005 000 043 T5    1/2013
(Continued)

OTHER PUBLICATIONS

Tsutsumi, J., et al., "Super-Isolation Duplexer Aiming for Removing Rx Inter-stage Filter in W-CDMA Handsets," Proceedings of the 38$^{th}$ European Microwave Conference, Oct. 27-31, 2008, Amsterdam, The Netherlands, pp. 1066-1069.

*Primary Examiner* — Dean Takaoka
*Assistant Examiner* — Alan Wong
(74) *Attorney, Agent, or Firm* — Slater & Matsil, L.L.P.

(57) ABSTRACT

A SAW filter has two DMS tracks. Each DMS track includes six converters, with two converters each acting as input or output converters. The two DMS tracks are electrically connected in series by way of four pairs of coupling converters and the associated coupling lines. A common inner ground line is provided between the two DMS tracks, which extends over the entire length of the DMS tracks and crosses the coupling lines. The input converters of the first DMS track are connected to an asymmetrical port, while the output converters of the second DMS track are connected to a symmetrical port.

23 Claims, 8 Drawing Sheets

(56) References Cited

U.S. PATENT DOCUMENTS

| | | |
|---|---|---|
| 7,369,015 B2 | 5/2008 | Takamine |
| 7,378,923 B2 * | 5/2008 | Takamine ............ 333/193 |
| 7,486,159 B2 * | 2/2009 | Fujii et al. ............ 333/193 |
| 7,868,716 B2 * | 1/2011 | Okuda ............ 333/133 |
| 7,872,548 B2 * | 1/2011 | Nishihara et al. ............ 333/133 |
| 7,898,366 B2 * | 3/2011 | Yasuda ............ 333/195 |
| 8,026,780 B2 * | 9/2011 | Kloska et al. ............ 333/193 |
| 8,305,160 B2 * | 11/2012 | Yamamoto et al. ............ 333/133 |
| 2006/0097824 A1 | 5/2006 | Detlefsen et al. |
| 2006/0192636 A1 * | 8/2006 | Ueda et al. ............ 333/195 |
| 2007/0018756 A1 | 1/2007 | Fujii et al. |
| 2008/0284540 A1 | 11/2008 | Nishihara et al. |
| 2009/0058555 A1 | 3/2009 | Takata et al. |
| 2009/0284328 A1 | 11/2009 | Wiesbauer et al. |
| 2009/0289740 A1 | 11/2009 | Takamine |
| 2010/0066461 A1 | 3/2010 | Yonekura |
| 2010/0148886 A1 | 6/2010 | Inoue et al. |

FOREIGN PATENT DOCUMENTS

| | | |
|---|---|---|
| EP | 1411634 A1 | 4/2004 |
| EP | 1 453 198 A2 | 9/2004 |
| EP | 1 763 133 A1 | 3/2007 |
| EP | 2 031 755 A1 | 3/2009 |
| JP | 2005184143 A | 7/2005 |
| JP | 2006186433 A | 7/2006 |
| JP | 2008028825 A | 2/2008 |
| WO | 03003574 A1 | 9/2003 |
| WO | 2006009021 A1 | 1/2006 |
| WO | WO 2008/074285 A1 | 6/2008 |
| WO | WO 2008/108113 A1 | 9/2008 |
| WO | WO 2008/146525 A1 | 12/2008 |
| WO | WO 2009/078095 A1 | 6/2009 |

\* cited by examiner

Frequenz [MHz]

Fig 3B

Frequenz [MHz]

SAW FILTER OPERATING IN A BALANCED/UNBALANCED MANNER

This patent application is a national phase filing under section 371 of PCT/EP2011/058059, filed May 18, 2011, which claims the priority of German patent application 10 2010 021 164.8, filed May 21, 2010, each of which is incorporated herein by reference in its entirety.

BACKGROUND

SAW filters for reception applications frequently require an unbalanced input and a balanced output so that they can be used without an additional balun between an unbalanced antenna connection and a transceiver IC with balanced signal processing. Such a reception filter can also be interconnected with a further filter operating in an unbalanced/unbalanced manner to form a duplexer. However, it is also possible to connect up a filter operating in a balanced/balanced manner to a balun, so that this connection to input and output can then likewise be operated in a balanced/unbalanced manner.

In a duplexer, further demands are made on the reception filter, for example a high level of common-mode isolation of greater than 60 dB between the transmission and reception filters and a high level of normal-mode isolation of more than 60 dB in the transmission band are demanded. Furthermore, a general aim in the case of filters is for them to be implemented as inexpensively as possible and to be equipped with as little insertion loss as possible. Furthermore, a high level of balancing is demanded at the balanced output, and variances are also intended to be at a minimum.

The U.S. Pat. No. 7,369,015 B2 discloses a SAW filter operating in a balanced/unbalanced manner which comprises two series-connected DMS tracks. Further known reception filters use a series circuit of a ladder type filter and a single-track DMS filter. Disadvantages of these interconnections are an inadequate level of isolation and a large chip surface area requirement.

SUMMARY OF THE INVENTION

One aspect of the invention provides a SAW filter that is suitable as a reception filter and that satisfies the aforementioned demands on an RX filter within a duplexer and, in particular, exhibits improved isolation for low chip surface area coverage and low insertion loss.

A SAW filter is specified which has two DMS tracks which are connected up to one another in series. A first DMS track is connected to an unbalanced port via two input transducers. However, it is also possible to provide a greater number of input transducers, but one which is always even for reasons of balancing.

In a geometrically parallel arrangement with the first DMS track is a second DMS track, in which two output transducers are connected to the two connections of a balanced port.

The first and second DMS tracks each have four coupling transducers, with the respective coupling transducer from the first and second DMS tracks being connected to one another by means of a coupling line.

Within each of the two DMS tracks, the transducers are arranged between two respective end reflectors which bound the respective DMS track. Arranged between the two DMS tracks and parallel thereto is a common inner ground line to which the ground connections of the input transducers and optionally, but not necessarily, also the end reflectors are connected.

The ground connections of the output transducers in the second DMS track can point toward the first DMS track and may be connected to a second inner line, which is arranged between the two DMS tracks and which is ungrounded and not connected to an outer ground potential. This prevents the output transducers from being also indirectly connected—by means of their connection to an outer ground potential—to other transducers in the first DMS track that are connected to ground. Galvanic couplings of the output transducers which could be routed via the ground potential are ruled out completely in this manner.

Both ends of the common inner ground line are preferably routed out of the space between the two tracks and connected to two ground connection points arranged outside the space between the two tracks. In this case and below, the term ground connection points is intended to be understood to mean all structures which can be used for connection to an external ground, such as bonding pads, ground bumps or bonding wires. However, it is also possible for the ground connection points to be provided in the space between the two DMS tracks at opposite ends of the common inner ground line.

In this case, the ground connection of a transducer is understood to mean that electrode of a transducer which does not carry signals and which is therefore either connected to a reference potential—the "ground"—or virtually at ground, for example when two signals of equal magnitude and opposite polarity compensate for one another at that point following direct electrical connection.

Since the common inner ground line and the coupling lines are arranged at right angles to one another, they must cross one another. A dielectric is arranged in the crossing region between the common ground line—which is preferably arranged at the top—and the coupling lines running underneath for the purpose of isolation and in order to avoid resistive losses.

Besides these two series-connected DMS tracks with six transducers each, the SAW filter does not require any further filter elements and therefore has a minimal chip surface area requirement, which is reduced in comparison with known solutions, for this reason alone. In addition, the chip surface area is minimized by virtue of there being no ground connection points arranged in the region between the two DMS tracks.

The common inner ground line, which preferably extends at least over the entire length of the DMS tracks, allows the ground currents from the first DMS track that drain via the ground line to be discharged in balanced fashion to both ends and, in particular, to be routed out of the space between the two DMS tracks. This succeeds in compensating for the magnetic moments induced by the carrying of the ground currents. This also reduces the magnetic coupling between the two DMS tracks that is brought about via the ground currents.

For full functionality, the filter does not require any further resonators which would need to be connected in series with the two DMS tracks. The filter has good balancing with just low insertion loss.

According to one embodiment, each of the two DMS tracks has a middle reflector which divides each DMS track into two track halves of equal size which then contain at least three or four transducers each. This middle reflector is used to divide each DMS track into two halves connected in electrical parallel which allow signals to be carried in a balanced manner to the balanced port of the second DMS track as early as on the input side, that is to say in the first DMS track.

Within each track half of the two DMS tracks, an input or output transducer is arranged between two coupling transducers. In the case of four input transducers, input transducers are then arranged alternately with coupling transducers. In this case, the series of finger connections is chosen such that the coupling lines connected to the two coupling transducers in a track half have a 180 degree phase difference relative to one another during operation of the filter and therefore provide coupling in a push-pull manner with the corresponding track half of the second DMS track.

In addition, the series of finger connections is chosen such that the middle two instances of the four coupling lines also operate in a push-pull manner with respect to one another, so that there is normal-mode coupling between all directly adjacent coupling lines. This has the advantage that the ground currents in the coupling transducers operating in a push-pull manner, and arranged next to one another, on the ground side are also out of phase and therefore cancel one another out, on the assumption that a direct electrical connection is provided. A ground that reacts to a positive potential brings about a different flow of current than a ground that is connected to a negative potential. When these "different" ground potentials are connected directly, there is—assuming the same current level—complete compensation for the ground currents as early as within the ground connections on the chip, which means that no ground currents need to flow to the housing, which ground currents would otherwise produce undesirable coupling between the input and the output of the filter.

According to one embodiment, the ground connections of the two inner coupling transducers in the first track point away from the second DMS track toward the unbalanced port and are connected to one another at that point by means of a first middle line. This line may be of ungrounded design and does not need to be connected directly to an outer ground potential.

To achieve good balancing, the middle reflector is connected to the first middle line. Furthermore, said middle reflector may be connected to the inner common ground line, as a result of which the first middle line is also provided with an electrical connection to an external ground potential by means of the middle reflector in the first DMS track.

According to a further embodiment, the ground connections of the two inner coupling transducers in the second DMS track point away from the first track toward the balanced port and are connected to one another at that point by means of a second middle line. In this second middle line, there is likewise compensation for opposed ground currents, so that the second middle line is also at virtual ground. The middle reflector in the second DMS track may be connected to the second middle line.

In one embodiment, the second middle line is connected to an outer ground potential.

In a further refinement of the invention, the electrostatic shielding between the two tracks is improved and the selection and isolation are increased by virtue of the two outer fingers of each coupling transducer in a first and a second track being at ground potential or at virtual ground. For the normal case, in which the electrode fingers are connected alternately to one of the two connections of the respective transducer, this requires an uneven number of electrode fingers in the coupling transducers. A finger that is connected to the ground potential or to virtual ground produces less interaction with an adjacent finger of an adjacent transducer and therefore produces a lower level of coupling between two adjacent transducers. Hence, the electrostatic coupling between input transducers and coupling transducers and also between coupling transducers and output transducers is reduced.

Further electrostatic shielding between the input and output sides is achieved by means of the common inner ground line, which is arranged between the two DMS tracks and protrudes beyond them at both ends. This common inner ground line therefore forms an electrostatic shielding bar.

The second inner line, which is arranged between the two DMS tracks, crosses two of the coupling lines. In the crossing region, the two lines crossing one another are therefore likewise isolated by a dielectric arranged between them. The dielectric may be patterned on a respective face which covers the two crossing regions for the same coupling line with the second inner and the common inner ground line and isolates each of the two crossing lines from one another at that point.

In a further embodiment, outer ground lines are provided beyond the ends of the two DSM tracks, said outer ground lines connecting the ground connection points in the extension of the common inner ground line around the end reflectors to the ground connections of the outer coupling transducers in each DMS track. The end reflectors may then be connected both to the inner common ground line and to the outer ground line.

According to a further embodiment, it is possible to separate the ground connections of the first and second DMS tracks from one another on the piezoelectric chip. In this case, all the ground connections of the transducers and reflectors in the first DMS track are separated from the ground connections of the second DMS track on the chip, that is to say are connected to separate ground connection points or are arranged at virtual ground. Using two additional ground connection points, it is thus possible for the two end reflectors and the coupling transducers in the second DMS track to be connected to ground. However, it is also possible for the two end reflectors in the second DMS track to be connected to one another by means of a second outer ground line and for the latter to be connected to a single central ground connection point which is isolated from the ground connections of the first DMS track.

The middle reflector in the second DMS track may be connected to the second middle line. Preferably, however, it is not connected to the second inner line, which is then separate from the ground connections of the inner coupling lines and thus has better isolation therefrom.

The crossing of interconnects, for example the crossing of the common inner ground line and the second inner line with the coupling lines, can be implemented by means of a metallization with a two-layer structure. Implemented in the first relatively thin metallization layer are the electrode fingers and the busbars of the transducers, the reflectors, the coupling lines, portions of the common middle line, of the second middle line and also possibly the first and/or the second outer ground line. Implemented in the thicker second metallization layer, situated above, are at least the still missing portions of the line structures and possibly of the electrical connecting rails of the transducers. Above at least one portion of the structures already formed in the first metallization layer it is possible to insert the second metallization layer for the purpose of reinforcing the first metallization layer in order to minimize resistive losses. Arranged in the crossing region, in which respective isolation of the two lines crossing one another is necessary, is a dielectric which is produced particularly from an organic polymer. However, inorganic dielectrics are also possible. The dielectrics are preferably layers that are patterned to produce rectangular spots and that are arranged around the respective crossing region.

At the points at which electrical contact is required between the first and second metallization layers, care is taken to ensure a sufficiently large contact surface area between the interconnects of the first and second metallization layers. This reduces the contact resistance and lessens the losses in the SAW filter. In order to minimize the interval between the two DMS tracks, the coupling lines may be implemented exclusively in the first metallization layer, because in this way it is possible to save the contact surface area between the first and second metallization layers that is necessary for a low-impedance connection.

The materials and design of the first and second metallization layers may match completely. However, it is also possible for the first and second metallization layers to be produced from different materials or with a different structure. In particular, it is possible for the topmost layer of the first metallization layer and the bottommost layer of the second metallization layer to be chosen such that a low contact resistance is produced.

Further refinements of the SAW filter relate to the number and arrangement of the electrode fingers. Thus, in particular, the coupling transducers connected to one another by means of coupling lines have the same number of electrode fingers. The inner coupling transducers in the two DMS tracks, which inner coupling transducers are connected to one another by means of a first middle line or the second middle line, may also each have the same number of electrode fingers. Between the inner and outer coupling transducers, the number of electrode fingers may differ. It may thus be advantageous for the inner coupling transducers to have a smaller number of electrode fingers than the remainder of the transducers in each DMS track. In the output transducers, the number of transducer fingers may be greater than in the input transducers.

For technical reasons, a DMS filter has different intervals between two transducers or between a transducer and a reflector. In order to reduce acoustic and hence also electrical losses on account of such an abruptly occurring finger/finger interval that differs from the normal interval, a plurality of "terminal" electrode fingers pointing to the respective adjacent transducer or reflectors may form a transition region in which there is an altered interval and/or an altered width of the electrode fingers or reflector strips between these terminal electrode fingers or between terminal reflector strips, so that the total difference deviating from the normal finger/finger interval is distributed over all finger/finger intervals in the transition region. In the transition region, the electrode finger interval and the finger widths in the case of the terminal fingers of two adjacent transducers are reduced in comparison with the normal electrode finger interval, which defines the resonant frequency before the center frequency of the transducer or filter. In the transition regions that point to one another between an outer reflector and a coupling transducer, the intervals and/or widths of the reflector strips or of the fingers of the respective reflector or transducer are larger than those of the normal fingers or reflectors in the transducer.

In this case, the transition region relates to a respective number of from 2 to 15, preferably 4 to 9, electrode fingers or reflector strips.

It is preferred for different transition regions to be produced in different sizes or to extend over a different number of terminal electrode fingers or of reflector strips. It is also possible to provide only one respective transition region for the transition from a transducer to the adjacent transducer or from a transducer to the adjacent reflector, which transition region thus then comprises the terminal electrode fingers or reflector strips of only one element, which is selected from the transducer and reflector.

In the transition region between a reflector and a transducer, the electrode finger interval or the reflector strip interval may have been altered by up to 5% in comparison with the normal value. In the transition region between two transducers, the electrode finger interval may have been altered by up to 10% in comparison with the normal value.

In all cases, the number of electrode fingers and reflector strips which are situated and have an altered position in the transition region is less than half the total number of electrode fingers or reflector strips in the respective transducer or reflector.

In a further refinement, the reflector strip interval is greater than the interval for the finger electrodes and exceeds the latter by up to 3.5%, for example.

The number of fingers in the two inner coupling transducers may be two less than that in the outer coupling transducers. The number of fingers in the two output transducers may be four greater than that in the two input transducers.

In a further refinement, the filter can be designed such that it can be operated in a balanced manner both at the input and at the output. In principle, in terms of design, this merely requires one of the input transducers in the first DMS track in the filter which can be operated in an unbalanced/balanced manner to be tilted, that is to say to be mirrored about an axis parallel to the DMS tracks. As a result of this measure, each of the electrode fingers in the mirrored transducer is provided with the opposite polarity.

BRIEF DESCRIPTION OF THE DRAWINGS

The invention is explained in more detail below with reference to an exemplary embodiment and the associated figures. The illustration of the transducers and reflector structures is purely schematic and also not to scale. Various dimensions such as intervals between the two DMS tracks and strip widths may be shown on a different scale.

DETAILED DESCRIPTION OF ILLUSTRATIVE EMBODIMENTS

Figure 1:
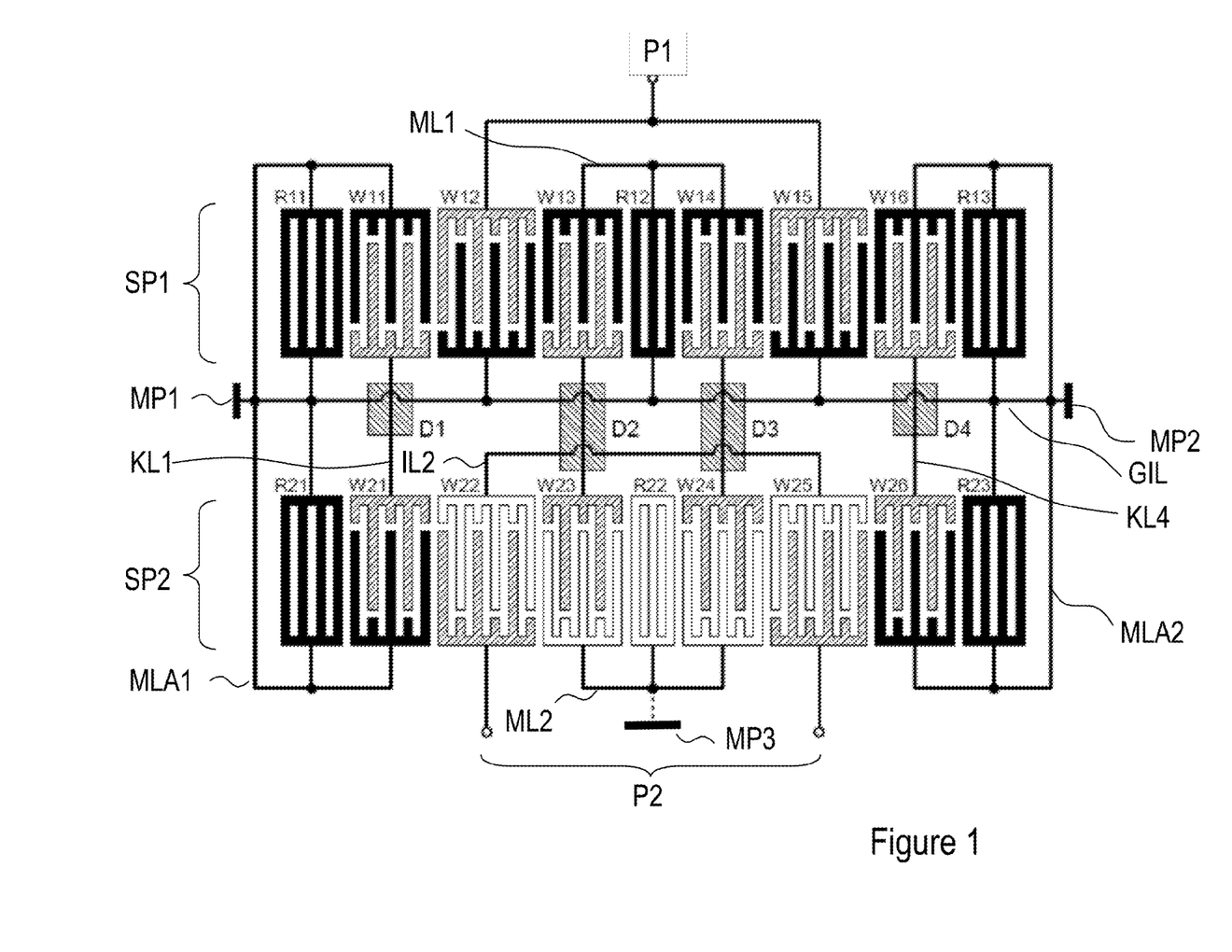
FIG. 1 shows a schematic arrangement of a first SAW filter according to the invention.

FIG. 1 shows a schematic illustration of an exemplary embodiment of a SAW filter according to the invention. The SAW filter comprises a first track SP1, which contains a total of six transducers W11 to W16 between a first and a second end reflector R11, R13. A middle reflector R12 divides the first DMS track into two track halves, each of which contains three transducers.

Arranged in parallel with the first track SP1 is a second DMS track SP2, which may have fundamentally the same design in respect of the transducer and reflector arrangement and, in this regard, may be of mirror-image symmetrical design with respect to the first DMS track, for example, the symmetry element used possibly being a virtual mirror plane situated between the two tracks. The symmetry does not apply to the individual transducers, however, which may be of different design in both tracks.

It is also possible for the two DMS tracks to have a different number of transducers. In particular, the number of input transducers in the first DMS track may differ from the number of output transducers in the second DMS track.

In each track half of the first DMS track SP1, the respective middle instance of the three transducers is used as an input transducer W12, W15. The two input transducers are connected in parallel with the unbalanced connection of the first port P1 of the SAW filter. In the left-hand track half of the first DMS track, the input transducer W12 is positioned between two coupling transducers W11, W13. The second input transducer W15 in the right-hand track half of the first DMS track SP1 is arranged between two coupling transducers W14 and W16.

In the second DMS track SP2, the two middle transducers in each track half are likewise used as output transducers W22, W25, which are connected to the two connections of the balanced port P2. The output transducer W22 in the left-hand track half of the second DMS track SP2 is arranged between two coupling transducers W21, W23, while the output transducer W25 in the right-hand track half is arranged between the two coupling transducers W24 and W26.

The two DMS tracks SP1, SP2 are connected in series with one another by means of four coupling lines KL1 to KL4. In this arrangement, each coupling line connects a coupling transducer in the first track to a corresponding coupling transducer in the second track. By way of example, the first coupling line KL1 connects the left-hand coupling transducer W11 in the left-hand track half of the first DMS track to the left-hand coupling transducer W21 in the left-hand track half of the second DMS track SP2. A similar situation applies to the remainder of the coupling transducers coupled in pairs W13/W23, W14/W24 and W16/W26.

The ground connections of the two input transducers W12, W15 point toward the second DMS track SP2 and are connected to a common inner ground line GIL that is arranged between the two DMS tracks. Said common inner ground line is routed in parallel with the two DMS tracks and has both ends routed out of the region between the DMS tracks. At that point, both ends of the common inner ground line GEL are connected to a respective ground connection point MP1, MP2. In addition, the middle reflector R12 and also the two end reflectors R11, R13 in the first DMS track are likewise connected to the common inner ground line GIL.

The end reflectors are the longitudinal ends of the respective DMS track. Two outer ground lines MLA1, MAL2, both longitudinal ends of which are routed around the respective end reflectors, are used to connect the ground connections of the two outer coupling transducers W11, W16 to the common inner ground line GIL or to the associated ground connection point MP1, MP2. Furthermore, the outer ground lines MLA1, MLA2 are extended downward and, at that point, are routed around the longitudinal ends of the second DMS track SP2 and are connected to the ground connections of the two terminal coupling transducers W21, W26 in the second DMS track SP2. Hence, the combination of common inner ground line GIL and the two outer ground lines MLA1, MLA2 provides electrostatic shielding between the first and second DMS tracks and shielding for the two longitudinal ends of the SAW filter.

The ground connections of the two inner coupling transducers W13, W14 in the first DMS track SP1 are connected to one another by a first middle line ML1. The middle reflector R12 in the first DMS track SP1 is also connected to this first middle line ML1. Furthermore, the middle reflector R12 is linked to the common inner ground line GIL. As a result, the two inner coupling transducers W13, W14 are electrically connected to an outer ground potential via the two ground connection points MP1, MP2.

The crossing region between each of the four coupling lines KL1 to KL4, the bottom of which rests on the substrate, and the common inner ground line GIL, which is routed above and transversely with respect to them, contains a respective patterned layer of a dielectric D1 to D4, which isolates the crossing lines from one another. In one exemplary embodiment, BCB (benzocyclobutene) is provided as the dielectric.

In the second DMS track SP2, the ground connections of the two output transducers W22, W25 are connected to a second inner line IL2. The latter crosses the two middle coupling lines KL2, KL3 and is likewise isolated from them by a dielectric. Advantageously, the dielectrics are for this purpose extended as appropriate by means of the second and third coupling lines KL2, KL3, as a result of which the faces thereof can provide the appropriate isolation for the first and second metallization layers or for the coupling line KL and the common inner ground line GIL or the second inner line IL2 in both crossing regions. The second inner line IL2 is not connected to an outer ground potential and is therefore ungrounded or a virtual ground.

The ground connections of the two inner coupling transducers W23, W24 in the second DMS track SP2 are connected to one another by means of a second middle line ML2, to which the middle reflector R22 in the second DMS track may also be connected. The second middle line ML2 may likewise be floating, but may alternatively also be connected to an outer ground potential.

FIG. 1 shows all transducer and reflector structures that are connected to an external ground potential in black. Transducer structures that carry signals are on a grey background, while transducer structures that are connected to virtual ground are shown in white or without colored highlighting. The figure shows each transducer with a greatly reduced number of electrode fingers in comparison with reality, and shows each reflector with a reduced number of reflector strips. The polarity of the respective terminal fingers of each transducer is reproduced correctly in this schematic illustration, however, so that the relevant polarity and series of finger connections for the entire arrangement is also evident therefrom. By way of example, it can clearly be seen that the coupling transducers W11, W13, W14 and W16 in the first track each have two outermost electrode fingers which are connected to external ground potential. In this way, there is electrostatic shielding between the input transducers and the coupling transducers connected to the second track.

While the input sides of the two input transducers W12, W15 are connected in parallel with the first port P1 and are therefore at the same potential, an appropriate finger arrangement ensures that the phase in the coupling lines KL differs by 180 degrees between two respective adjacent coupling lines. This has the advantage that, by way of example, the ground currents on the two middle coupling transducers W13, W14 cancel one another out on account of the different polarity on the first middle line ML1, as a result of which the current flowing to the external ground connection via the middle reflector R12 is at a minimum.

The ground currents which are obtained by virtue of the ground connections of the two input transducers being linked are in phase. However, since the ground currents are discharged in balanced fashion to both longitudinal ends of the SAW filter, the high level of balancing means that two ground currents of equal magnitude which are routed to the ground connection points MP1, MP2 are obtained in practice. The electromagnetic fields linked to the currents therefore have a different polarity and likewise compensate for one another.

The crossing of different interconnects in the SAW filter according to the invention requires two different metallization layers which are produced at separate times. Between when the two metallization layers are applied, the dielectrics also need to be arranged in the crossing region.

At any rate, the first metallization layer comprises all the elements of the two DMS tracks, that is to say the metallizations for the reflectors and the transducers. The first metallization layer likewise contains the coupling lines KL1 to KL4. Following the production of the first metallization layer, which usually comprises application and patterning, for example by means of a lift-off technique, a respective patterned layer of a dielectric D1 to D4 is applied in said crossing regions.

Next, the second metallization layer is produced, which comprises at least the common inner ground line GIL and the second inner line IL2, which cross the coupling lines or portions of the coupling lines above the dielectrics. All other lines can be produced using either the first metallization layer or the second metallization layer. It is also possible for portions of the metallizations to be constructed from both metallization layers and in this way for the line resistances to be reduced. Preferably, the association with the first or second metallization layer is made from the point of view that as few transitions as possible from the first to the second metallization are necessary. These transitions are a point with a potentially high impedance by means of which losses can occur. A sufficiently low-impedance cross-sectional area for the connection between the first and second metallization layers therefore has a sufficiently large surface area. The interval between the first and second DMS tracks can be minimized with low resistive losses if the coupling lines are produced exclusively in the first metallization layer, while both metallization layers are used for the common inner ground line GIL and the second inner line IL2.

However, it may also be advantageous for the transition from the first to the second metallization layer to be made exclusively in the region of the busbars of the transducers or reflectors, since at that point there is a larger surface area available for shaping a low-impedance transition. From this point of view, it is additionally possible for the two outer ground lines MLA1 and MLA2 and also all conductor sections that are connected to the common inner ground line GEL and the two outer ground lines MLA to be produced in the second metallization layer or in both metallization layers.

In each DMS track, the pitch, which is fundamentally the same for all transducers, determines the center frequency of the surface wave that is induced by this transducer, or the center frequency of the electrical signal that is decoupled from the surface wave by means of such a transducer. Normally, all of the electrode fingers in the transducers have a common pitch that corresponds to this center frequency. Different numbers of electrode fingers mean that the finger periods in the homogeneous region, that is to say in the region of the transducers which is of uniform design and is not a transition region, of different transducers are chosen differently.

However, since the mode of operation of the DMS filter means that not all transducers are situated on the same grid and are therefore displaced relative to one another, intervals may arise between the two outermost fingers of adjacent transducers, which intervals differ greatly from the pitch. This can result in inhomogeneities and hence in losses. In order to moderate this, the electrode finger interval (pitch) in the transition region between adjacent transducers is adapted as appropriate, so that it is distributed over all electrode finger intervals in the transition region. This results in the electrode finger interval in the transition region between two transducers being reduced. The transition region comprises a number of terminal transducer fingers which may be between 2 and 15.

In the transition region between a reflector, preferably an outer reflector, and a directly adjacent transducer, the pitch can likewise be varied and, in particular, raised.

It is advantageous if the transition regions are chosen to be of different magnitude and are distributed in an unbalanced manner over the entire respective DMS track SP. It is even possible to design transitions between two adjacent transducers or between a transducer and a directly adjacent reflector such that only one of the two elements has a transition region, while the other element has terminal fingers with an unaltered pitch.

Independently of this, it is advantageous to increase the pitch in the reflectors in comparison with the normal pitch, for example by up to 3.5 percent.

The number of fingers in the two inner coupling transducers (W13 and W14 in the first track or W23 and W24 in the second track) may be lower than that in the coupling transducers arranged on the outside and have two fingers fewer, for example. The number of electrode fingers in the two output transducers is four higher than those in the two input transducers, for example.

A SAW filter according to the invention as shown by way of example in FIG. 1 can advantageously be used as a reception filter, particularly as an RX filter in a duplexer. To this end, the first unbalanced port P1 is connected to an antenna connection. Preferably, the antenna connection and the first port also have a capacitance connected between them which, by way of example, may be in the form of an interdigital structure corresponding to a transducer. This then preferably has a pitch which differs greatly from the center frequency of the DMS track, and the finger orientation of said interdigital structure may also be twisted relative to the transducers in the DMS track.

Figure 2A:
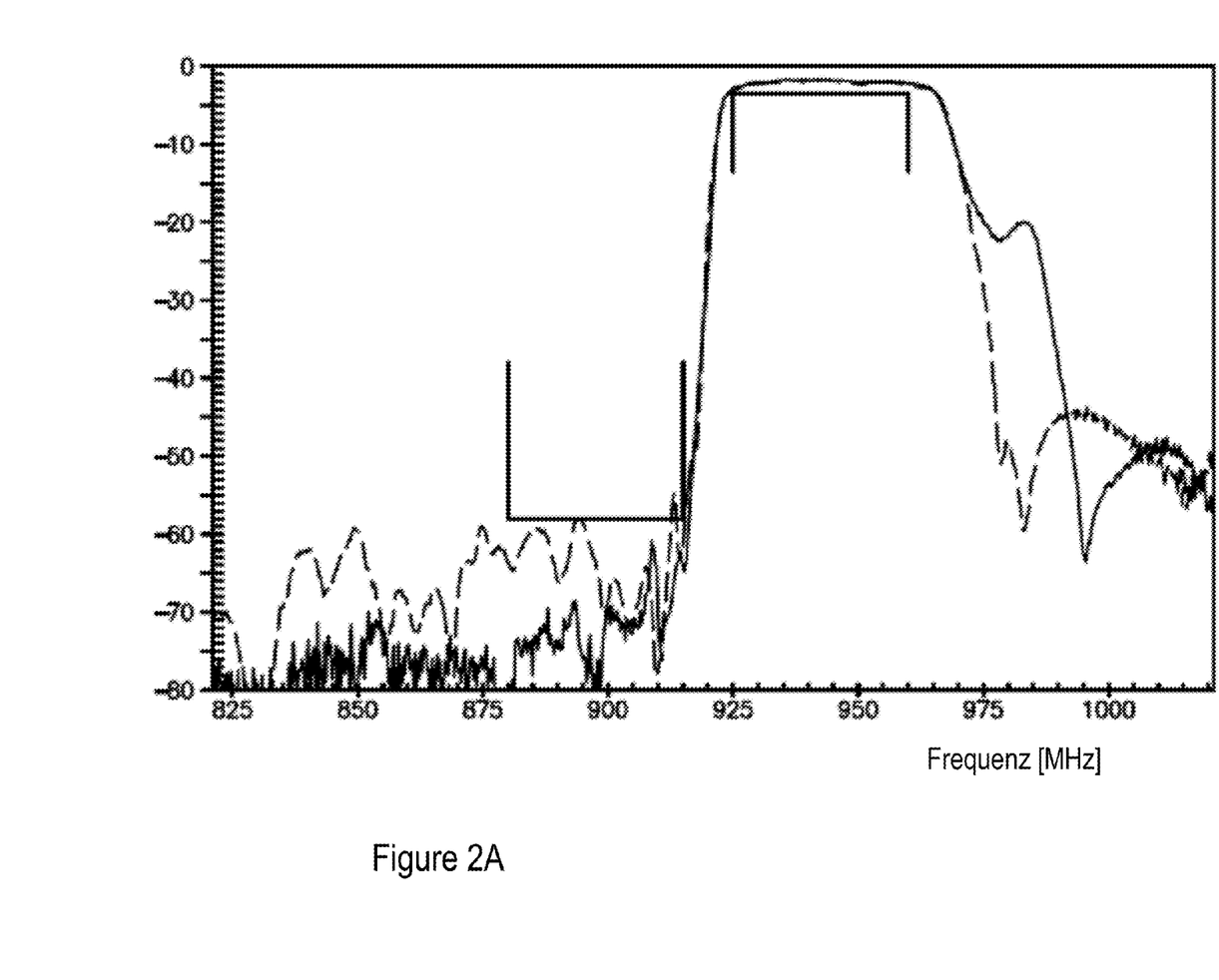
FIGS. 2A and 2B show the transmission curves of a reception filter according to the invention in comparison with a known reception filter, both reception filters being operated as part of a duplexer.

FIG. 2A shows the transmission curves of the filter according to the invention and of a known reception filter with just one DMS track and additional resonators in comparison when both filters are operated as reception filters in a duplexer. The transmission curve of the filter according to the invention is solid, while that of the known filter is shown as a dashed line. It can be seen that the selection is improved particularly in the lower frequency range, that is to say below the passband.

Figure 2B:
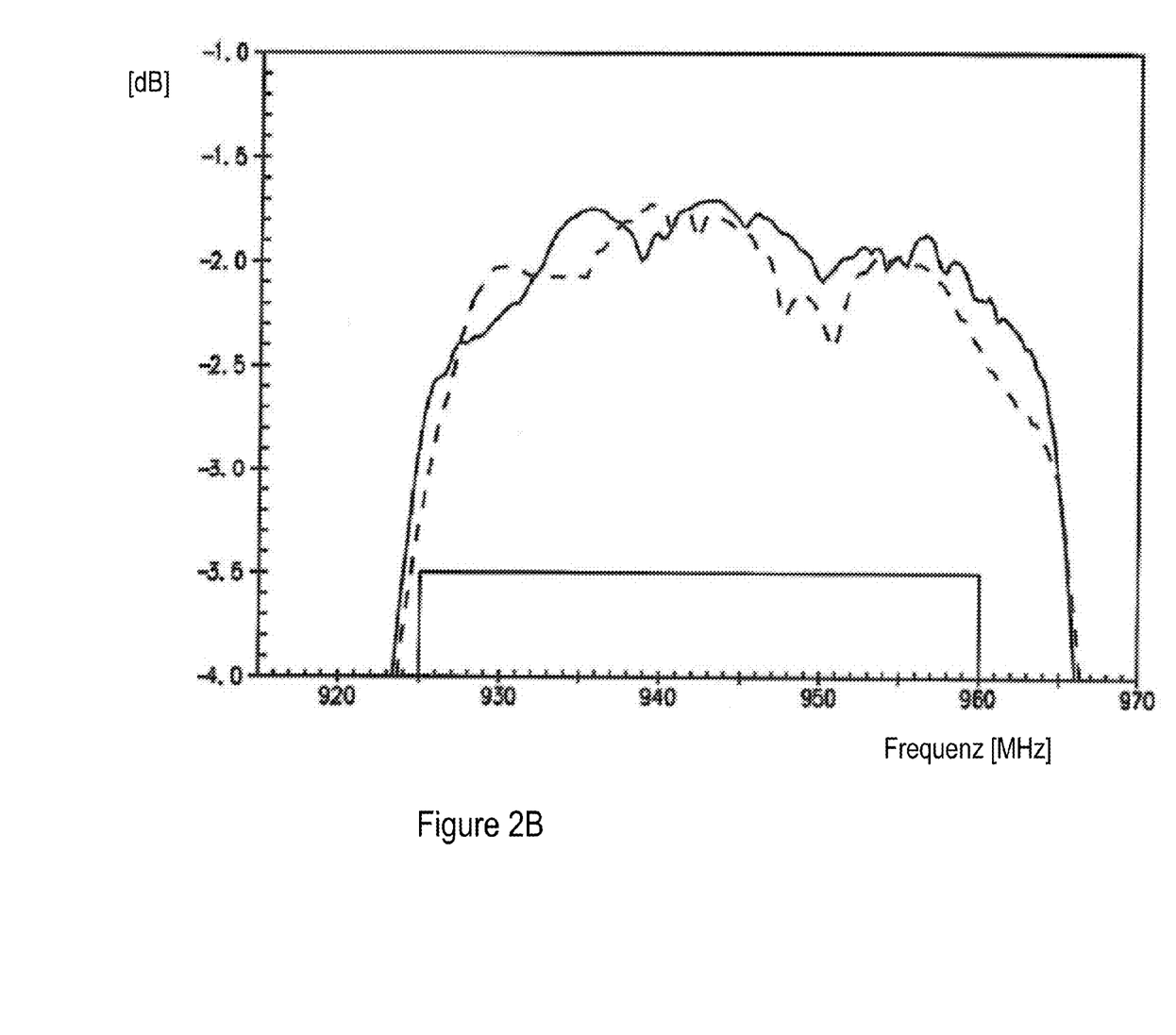

FIG. 2B shows an enlarged illustration of the passband, again in comparison with the passband of a known filter. It can be seen that the filter according to the invention has less ripple in the passband and lower insertion loss.

Figure 2C:
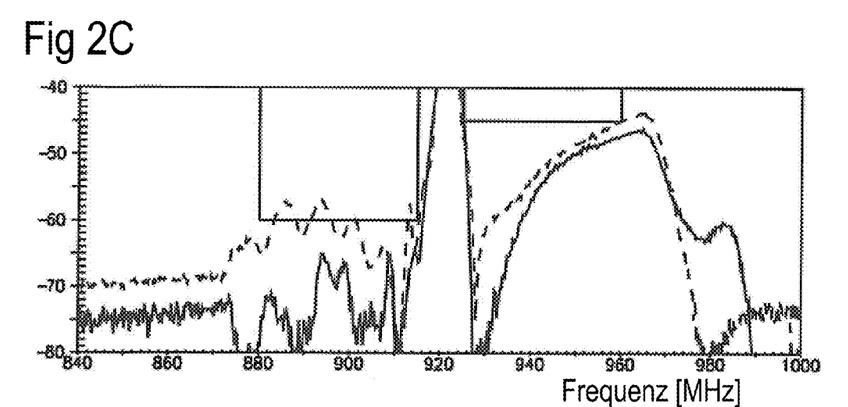
FIG. 2C shows the normal-mode isolation of the duplexer with a reception filter according to the invention in comparison with a known reception filter.
Figure 2D:
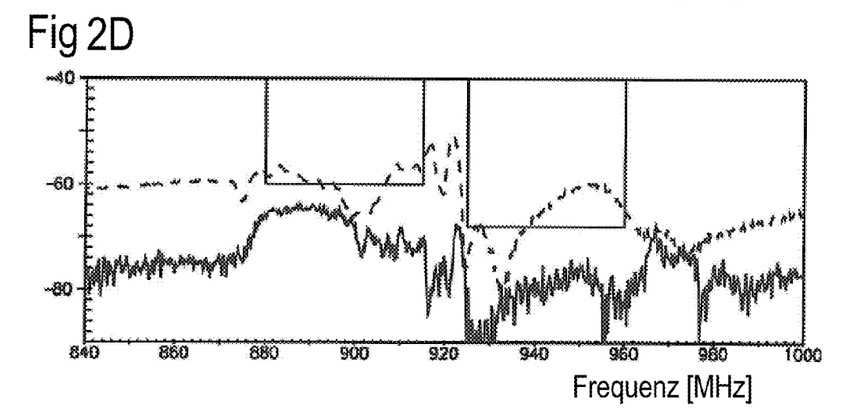
FIG. 2D shows the common-mode isolation of the duplexer with a reception filter according to the invention in comparison with a known reception filter.
Figure 2E:
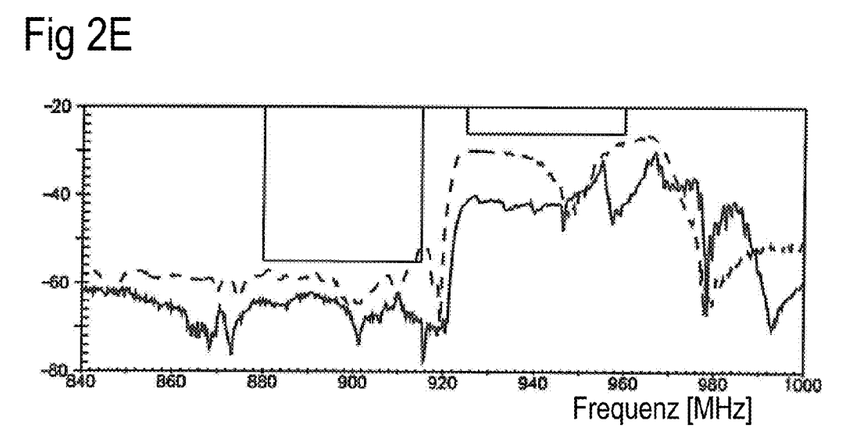
FIG. 2E shows the common-mode rejection between antenna and Rx output of the duplexer for a reception filter according to the invention in comparison with a known reception filter.

FIGS. 2C, 2D and 2E show the normal-mode isolation (FIG. 2C), the common-mode isolation (FIG. 2D) and the common-mode rejection of the reception filter according to the invention (FIG. 2E) as further parameters. In this case too, it can be seen that the filter according to the invention also exhibits an improvement in these parameters in comparison with the known parameters and has increased selection, in particular.

Figure 2F:
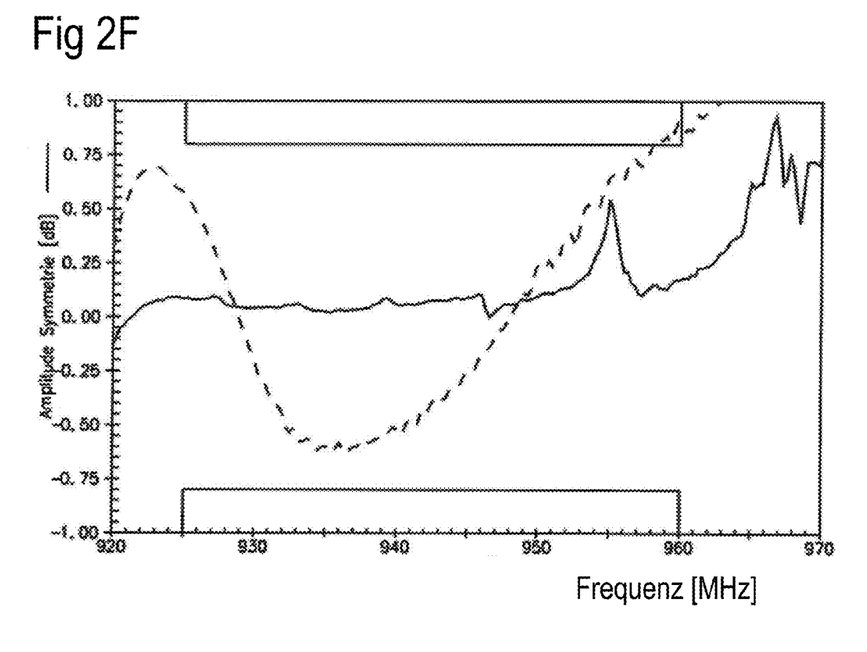
FIG. 2F shows the amplitude balance of the balanced port.

FIG. 2F shows the balancing of the output signal as determined at the balanced second port P2. It shows the amplitude difference—plotted over frequency—between the two connections, which is significantly improved in the filter according to the invention in comparison with the known filter shown in the comparison.

Figure 2G:
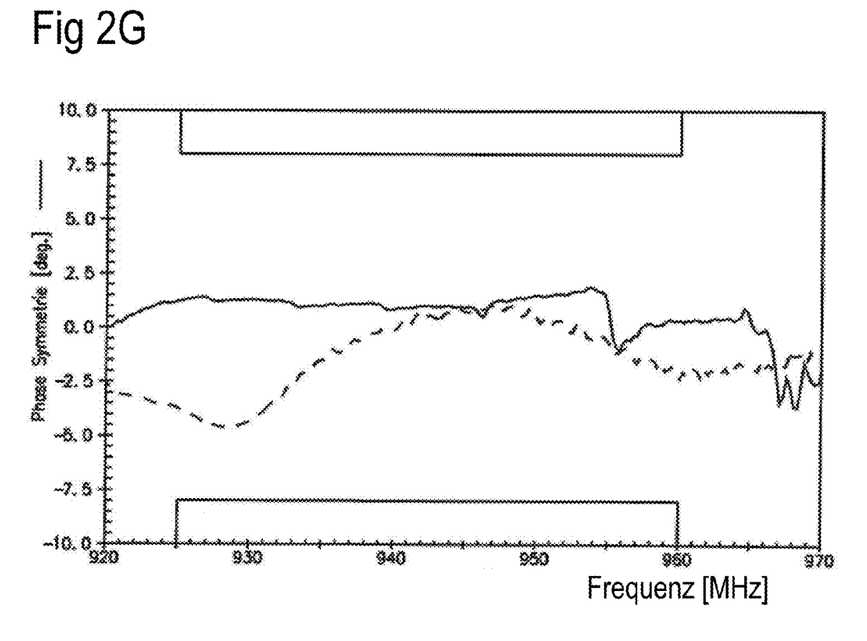
FIG. 2G shows the phase balance of the balanced port.

FIG. 2G shows the phase balance at the second port P2 of the filter according to the invention, with the phase difference between the two connections of the second port being plotted against frequency. In this case too, a high level of phase balance can be seen, which means that the phase difference moves almost over the entire passband range in the region of the zero line.

The high level of balancing at the second port results, in particular, in a high level of normal-mode isolation (see FIG. 2C), in comparison with a TX filter, of more than 60 dB, specifically in the TX band. The common-mode isolation, which reproduces particularly couplings between portions of the filter according to the invention which carry the common mode and an adjacent filter, for example the TX filter of the duplexer, is also significantly improved in comparison with a known filter and has more than 60 dB, for example (see FIG. 2D).

FIGS. 3A to 3G show the same parameters as FIGS. 2A to 2G in comparison with appropriately varied exemplary embodiments. The exemplary embodiment shown in FIG. 1 (shown with a solid line in each of the figures) is compared with a first modification, in which the common inner ground line GIL and the second inner line IL2 have a direct electrical connection to one another (see the curves with the evenly dashed line). In a second modification, the common inner ground line GIL has a DC interruption in the center, which means that the ground connections of the two input transducers W12, W15 are connected to different ground connection points MP1, MP2. In the graphs, the lines corresponding to the second modification are in dash-dot form.

Figure 3A:
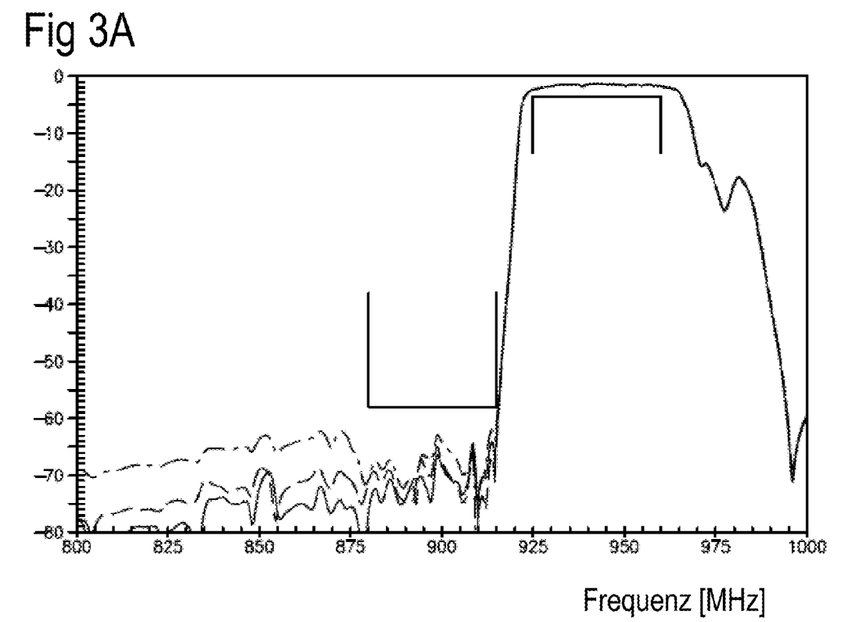
FIGS. 3A to 3G show the same parameters as FIGS. 2A to 2G for the first exemplary embodiment in comparison with the corresponding parameters from varied exemplary embodiments.
Figure 3B:
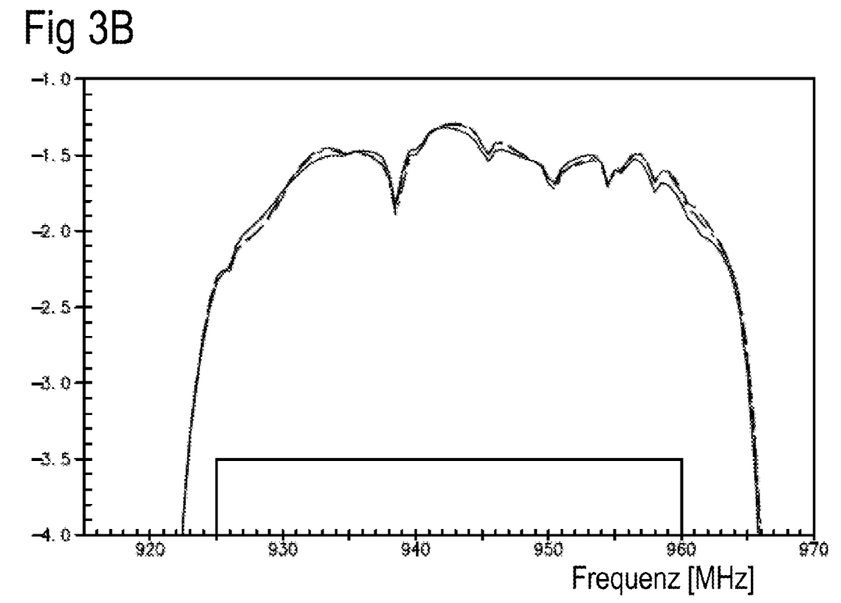
Figure 3C:
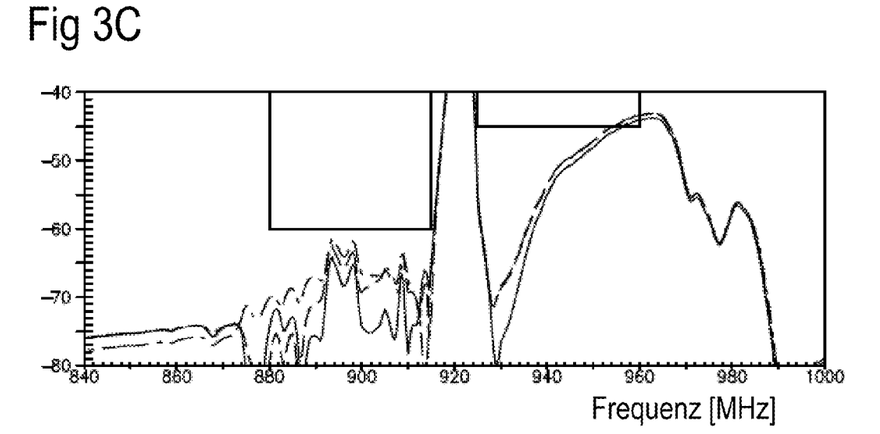
Figure 3D:
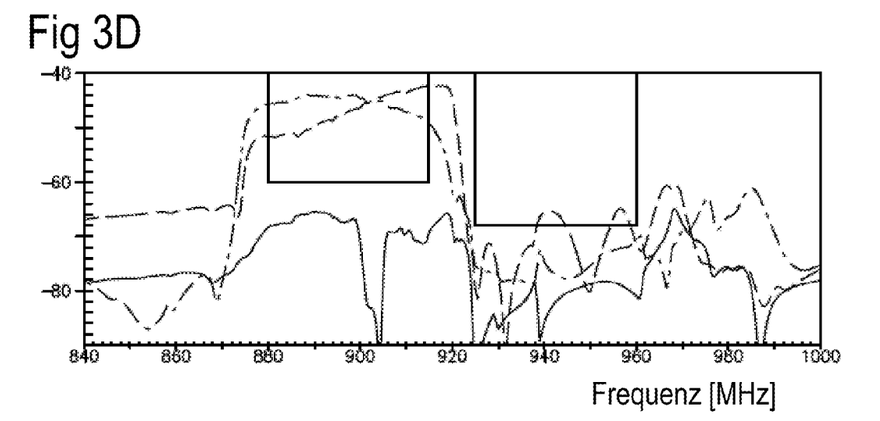
Figure 3E:
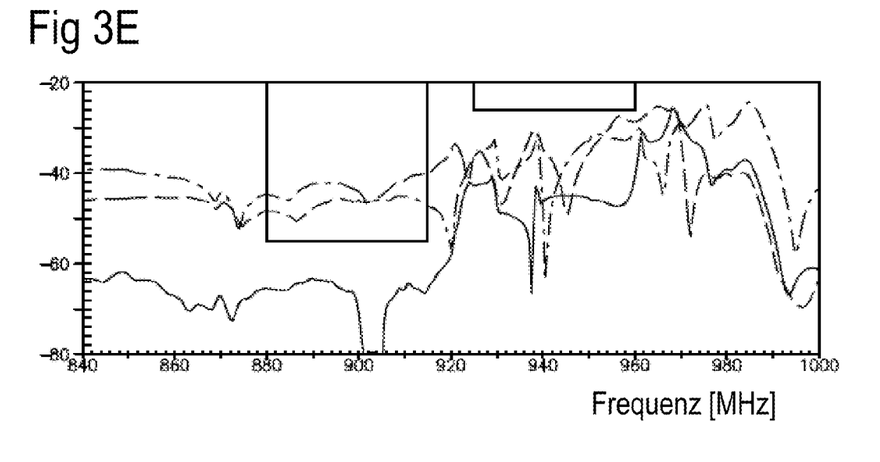
Figure 3F:
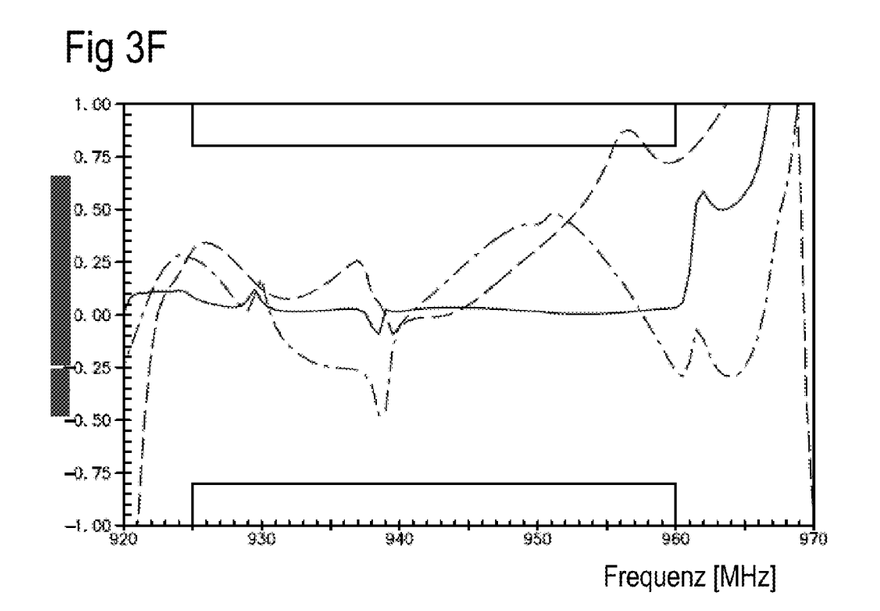
Figure 3G:
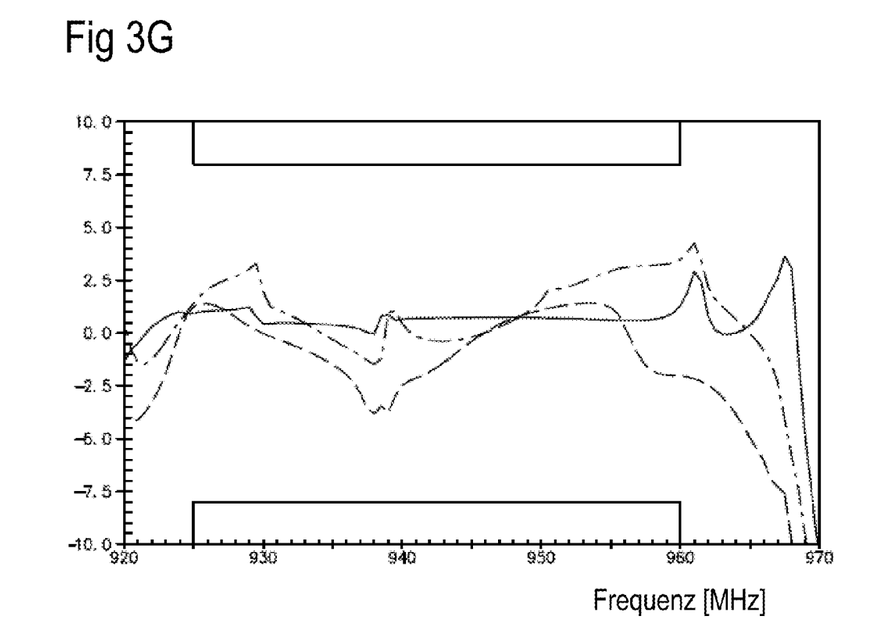

FIG. 3A shows that in the first exemplary embodiment, as shown in FIG. 1, a slightly improved isolation in the lower frequency range is achieved in comparison with the two modifications. By contrast, the isolation in the first exemplary embodiment is improved significantly and to some extent by more than 20 dB, as is evident from FIGS. 3C to 3E. The balancing at the second port is also best in the first exemplary embodiment, as is evident from FIGS. 3F and 3G.

The surface area requirement for the filter according to the invention is reduced in comparison with known RX filters. Particularly in the lateral direction, that is to say vertically with respect to the (longitudinal) extent of the DMS tracks, the surface area requirement is reduced when the ground connection points MP are situated outside the region of the DMS tracks and also have no additional surface area requirement in the lateral direction. Since there is usually more space on the chip surface in the longitudinal direction, the "outer" ground connection points of the SAW filter according to the invention require no additional chip surface in practice.

The invention is not limited to the embodiment shown in FIG. 1. In the exemplary embodiment, all advantageous refinements are shown together in combination but are not all required together for a SAW filter according to the invention. Filters covered by the invention may therefore have fewer features than those presented.

The invention claimed is:

1. A SAW filter comprising:
   a balanced port and an unbalanced port;
   a first DMS track wherein two input transducers are arranged in the first DMS track and connected to the unbalanced port; and
   a second DMS track that is arranged geometrically parallel to the first DMS track, wherein two output transducers are arranged in the second DMS track and are connected to the balanced port;
   wherein the first DMS track and the second DMS track each have four coupling transducers;
   wherein four coupling lines connect a respective coupling transducer from the first and second DMS tracks to one another and are thus an electrical series interconnection of the first and second DMS tracks;
   wherein the coupling transducers of the first DMS track have finger arrangements causing a phase in each of respective adjacent ones of the coupling lines to differ by 180 degrees;
   wherein the transducers in each DMS track are arranged between two respective end reflectors that bound the respective DMS track;
   wherein ground connections of the input transducers point toward the second DMS track and are connected between the first and second DMS tracks to a common inner ground line that is arranged in a space between the first and second DMS tracks and both ends of which are connected to a respective ground connection point;
   wherein, in the second DMS track, ground connections of the output transducers point toward the first DMS track and are connected to a second inner line, which is arranged between the first and second DMS tracks and which is at zero potential;
   wherein the common inner ground line and the second inner line cross the coupling lines, with a respective dielectric being arranged between the common inner ground line and also the second inner line and the coupling lines in a crossing region such that the second inner line and the common inner ground line are electrically isolated from each other and from the coupling lines;
   wherein each of the first and second DMS tracks contains a middle reflector that divides each DMS track into two track halves;
   wherein the ground connections of two innermost coupling transistors disposed in the first DMS track are connected by a first middle line;
   wherein the middle reflector disposed in the first DMS track is connected to the first middle line and to the common inner ground line; and
   wherein there are no lines crossing each other beyond the first DMS track towards the unbalanced port and no lines crossing each other beyond the second DMS track toward the balanced port.

2. The filter according to claim 1, wherein each track half of each DMS track having at least three transducers.

3. The filter according to claim 2, wherein each track half of the two DMS tracks contains each of the input or output transducers between two respective coupling transducers.

4. The filter according to claim 2, wherein in the second DMS track, the middle reflector is connected to the ground connections of two inner coupling transducers in the second DMS track by the second middle line.

5. The filter according to claim 1, wherein ground connections of inner coupling transducers in the first DMS track point away from the second DMS track toward the unbalanced port, wherein the ground connections are connected to one another by a first middle line, the first middle line in turn being connected to an outer ground potential.

6. The filter according to claim 1, wherein ground connections of inner coupling transducers in the second DMS track point away from the first DMS track toward the balanced port, where the ground connections are connected to one another by a second middle line.

7. The filter according to claim 6, wherein the second middle line is connected to ground potential.

8. The filter according to claim 1, wherein the coupling transducers in the first and second DMS tracks have an uneven number of electrode fingers, two outer fingers being at ground potential or reference potential.

9. The filter according to claim 1, wherein two outer coupling transducers in the first DMS track and two outer coupling transducers in the second DMS track are connected around the end reflectors to two ground connection points or to the common inner ground line by two outer ground lines.

10. The filter according to claim 1, wherein the ground connections of the two DMS tracks are electrically separate on a piezoelectric substrate.

11. The filter according to claim 1, wherein the number of electrode fingers in interconnected coupling transducers is the same.

12. The filter according to claim 1, wherein the number of transducer fingers in inner coupling transducers in each DMS track is smaller than in other transducers.

13. The filter according to claim 1, wherein the number of transducer fingers in the output transducers is larger than the number of transducer fingers in the input transducers.

14. The filter according to claim 1, wherein some elements from a group consisting of the end reflectors, middle reflectors and the transducers have a transition region that points toward the respective adjacent element and wherein a plurality of reflector strips or transducer fingers are at an interval from one another and/or have a width that is different than that of remaining ones of the reflector strips or electrode fingers in the respective element.

15. The filter according to claim 14, wherein at least one element at a transition between an end reflector and a directly adjacent transducer has a transition region formed on it in which the width and/or the interval of the reflector strips or electrode fingers is larger than in a remainder of the region of this element which is not a transition region.

16. The filter according to claim 14, wherein one or both transducers at the transition between two directly adjacent transducers has/have a transition region in which a plurality of reflector strips or transducer fingers are at a finger interval, are at an interval or have a width which is smaller than in a remainder of the region of this transducer which is not a transition region.

17. The filter according to claim 14, wherein different transition regions are formed in different ways within a DMS track and are distributed in an asymmetrical manner at least over the respective track half.

18. The filter according to claim 1, wherein all of the lines, ground lines and coupling lines are formed from metallization on a piezoelectric chip.

19. The filter according to claim 18, wherein the lines, ground lines and coupling lines are either produced in one of two different metallization layers on the piezoelectric chip or comprise both metallization layers.

20. The filter according to claim 1, wherein the unbalanced port is connected to an antenna connection via a serial two-terminal element, wherein the two-terminal element behaves capacitively below a passband of the filter.

21. The filter according to claim 20, wherein the two-terminal element is in the form of an interdigital structure on a piezoelectric chip.

22. The filter according to claim 20, wherein the antenna connection is connected in parallel to a coil that is connected to a reference potential or ground.

23. The filter according to claim 1, wherein the filter is used as an Rx filter in a duplexer.

* * * * *

UNITED STATES PATENT AND TRADEMARK OFFICE
CERTIFICATE OF CORRECTION

| | | |
|---|---|---|
| PATENT NO. | : 9,130,538 B2 | Page 1 of 1 |
| APPLICATION NO. | : 13/697328 | |
| DATED | : September 8, 2015 | |
| INVENTOR(S) | : Thomas Bauer | |

It is certified that error appears in the above-identified patent and that said Letters Patent is hereby corrected as shown below:

In The Claims
In Col. 12, line 42, claim 1, delete "transistors" and insert --transducers--.

Signed and Sealed this
Twenty-second Day of March, 2016

Michelle K. Lee
*Director of the United States Patent and Trademark Office*